United States Patent
Nicolai

(10) Patent No.: US 6,912,615 B2
(45) Date of Patent: Jun. 28, 2005

(54) CONTROL MEANS FOR BURST ACCESS CONTROL

(75) Inventor: Volker Nicolai, Harsefeld (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 174 days.

(21) Appl. No.: 10/236,176

(22) Filed: Sep. 6, 2002

(65) Prior Publication Data

US 2003/0074517 A1 Apr. 17, 2003

(30) Foreign Application Priority Data

Sep. 7, 2001 (DE) .......................................... 101 43 999
Oct. 11, 2001 (DE) .......................................... 101 50 125

(51) Int. Cl.[7] .............................................. G06F 12/00
(52) U.S. Cl. ........................ 711/5; 711/100; 711/111; 711/170; 711/171; 711/173; 711/200; 711/203; 711/206; 711/209; 711/212; 365/189.01; 365/189.04; 365/203; 365/220; 365/221; 365/230.01; 365/230.03; 365/230.04; 365/230.09
(58) Field of Search .......................... 711/5, 100, 111, 711/170–171, 173, 200, 203, 206, 209, 212, 202, 205, 207; 365/189.01, 189.04, 203, 220, 221, 230.01, 230.03, 230.04, 230.09

(56) References Cited

U.S. PATENT DOCUMENTS

| | | | | | |
|---|---|---|---|---|---|
| 4,691,281 A | * | 9/1987 | Furui | .......................... | 711/207 |
| 5,611,071 A | * | 3/1997 | Martinez, Jr. | ................ | 711/133 |
| 5,751,979 A | * | 5/1998 | McCrory | ..................... | 345/803 |
| 5,848,023 A | * | 12/1998 | Kato et al. | .............. | 365/230.09 |
| 6,138,214 A | * | 10/2000 | Pfefferl | ......................... | 711/137 |
| 6,336,154 B1 | * | 1/2002 | McCarthy et al. | ............. | 710/35 |
| 6,415,374 B1 | * | 7/2002 | Faue et al. | .................. | 711/173 |
| 6,418,077 B1 | * | 7/2002 | Naven | ......................... | 365/233 |
| 6,457,114 B1 | * | 9/2002 | Paluch | ......................... | 711/219 |

* cited by examiner

Primary Examiner—Matthew Kim
Assistant Examiner—Zhuo H. Li
(74) Attorney, Agent, or Firm—Michael J. Ure

(57) ABSTRACT

The invention relates to a control means for controlling burst accesses to a synchronous dynamic semiconductor memory device comprising at least two memory banks. In order to avoid relatively large time losses due to preparation cycles (precharge and activate), the invention provides an address converter unit (12) for converting a logical access address into physical access addresses by splitting the burst access into at least two partial burst accesses, wherein a first physical access address addresses a first memory area of a first memory bank for a first partial burst access and wherein a second physical access address addresses a second memory area of a second memory bank for a second partial burst access.

8 Claims, 7 Drawing Sheets

CONTROL MEANS FOR BURST ACCESS CONTROL

The invention relates to a control means for controlling burst accesses to a synchronous dynamic semiconductor memory device comprising at least two memory banks. The invention additionally relates to a method of controlling burst accesses.

Synchronous dynamic semiconductor memory devices (SDRAMs), as are widely known and used, have the disadvantage that relatively large time losses arise in the event of randomly distributed accesses due to the so-called preparation cycles "precharge" and "activate". In particular in the case of random burst accesses, i.e. in the case of read or write accesses to the memory, in which a plurality of data words are to be read out or written in with one command, which words are located next to one another in the memory, this may be very troublesome, since it is precisely such burst accesses which are intended to allow rapid data access.

Most SDRAMs currently available on the market and which meet the JEDEC standard are so constructed that they consist internally of a plurality of separately triggerable storage units, or memory banks, with corresponding trigger logic. These memory banks are connected via multiplexers or decoders with the data inputs and data outputs and may be triggered with partial time overlap, wherein the one memory bank may be prepared for the next access while data access, i.e. read or write access, is performed in relation to another memory bank.

Since several cycles in which the data bus is blocked often pass between the preparation cycles (precharge and activate) and actual data access, time losses have to accepted with such accesses. It is therefore an object of the invention to provide a control means and a method of controlling and readdressing burst accesses to a synchronous dynamic semiconductor memory device comprising at least two memory banks, with which means and method these time losses may be substantially reduced or even wholly prevented.

This object is achieved according to the invention by a control means as claimed in claim 1, which comprises an address converter unit for converting a logical access address into physical access addresses by splitting the burst access into at least two partial burst accesses, wherein a first physical access address addresses a first memory area of a first memory bank for a first partial burst access and wherein a second physical access address addresses a second memory area of a second memory bank for a second partial burst access. The stated object is achieved, moreover, by a method as claimed in claim 7.

The invention is based on the recognition that it is advantageous to change the memory bank which is being accessed with each burst access, irrespective of whether or not a page or row change occurs. To this end, according to the invention, readdressing takes place, which ensures that the memory bank is changed between two consecutive accesses and which maps an arising virtual (logic) address space completely to a correspondingly sized, real (physical) address space, as far as possible without gaps or dual assignments.

According to the invention, a burst access to a particular logical access address of the memory area is converted into two partial burst accesses, wherein each of the two partial burst access addresses a different memory bank and therein in each case a particular memory area. It may thus be ensured that no or only minimal delays arise due to preparation cycles; namely, while the first partial burst access is performed, i.e. writing to the first memory bank or reading from the first memory bank, preparation of the second partial burst access may take place at the same time.

Advantageous developments of the control means according to the invention are indicated in the subclaims. Through the advantageous development as claimed in claim 2, according to which the column addresses of the first and second physical access addresses adjoin one another, it may be simply ensured that the physical address space, i.e. the memory area present in the semiconductor memory device, is fully occupied without gaps or dual assignment occurring. The logical address space of the logical access addresses may thus be simply mapped in full to a physical address space of corresponding size.

The greatest possible time saving may be achieved in particular in that, as already mentioned and as indicated in claim 3, a second partial burst access is prepared during a first partial burst access. Once the first partial burst access is complete, the second partial burst access may thus be immediately performed, i.e. read or written, without delay caused by preparation cycles.

With the development indicated in claim 4, "cross-addressing" is possible, i.e. a first burst is subdivided into first and second partial burst accesses to first and second memory areas of the first or second memory bank respectively, and a second burst access is subdivided into first and second partial burst accesses in each case to the same two memory banks, wherein different memory areas are addressed, however. Addressing preferably proceeds in such a way that the memory areas in the first and second memory banks adjoin one another, in order to achieve simple, complete filling of the physical memory area.

In the case of the advantageous development as claimed in claim 5, memory areas of the same address in different memory banks are preferably accessed. In this development, the physical address space is preferably compressed, i.e. physical addresses comprise a larger bit count, preferably one more bit, than logical addresses. Thus, for example, M memory banks of the physical address space are mapped to N/2 memory banks in the logical address space, by omitting one bit during logical addressing, namely for example a bit specifying the memory bank of the physical address space.

With the method according to the invention or the control unit according to the invention for read and write access, a burst should preferably always performed with the same even number of words. A dedicated or exclusive memory area for the accesses should be provided, which is used only with this type of burst, since otherwise the data of the memory could be overwritten by mistake.

The method according to the invention is particularly useful for the transfer of large quantities of data and with hardware architectures which have to manage without a cache, i.e. in which re-sorting of the data is not possible or sensible prior to memory access. Advantages are obtained in particular in the case of closely succeeding accesses, i.e. in the case of time-critical data throughput to various areas within the dedicated memory and in the case of frequent page or row change and in the case of bursts of size 4 upwards.

The control arrangement according to the invention with semiconductor memory device may be used particularly advantageously for video applications, in which the speed advantage which the arrangement offers is particularly important, since a video data stream must under no circumstances be broken, as otherwise image disturbance immediately occurs.

The invention will be further described with reference to examples of embodiments shown in the drawings, to which, however, the invention is not restricted. In the Figures.

Figure 1:
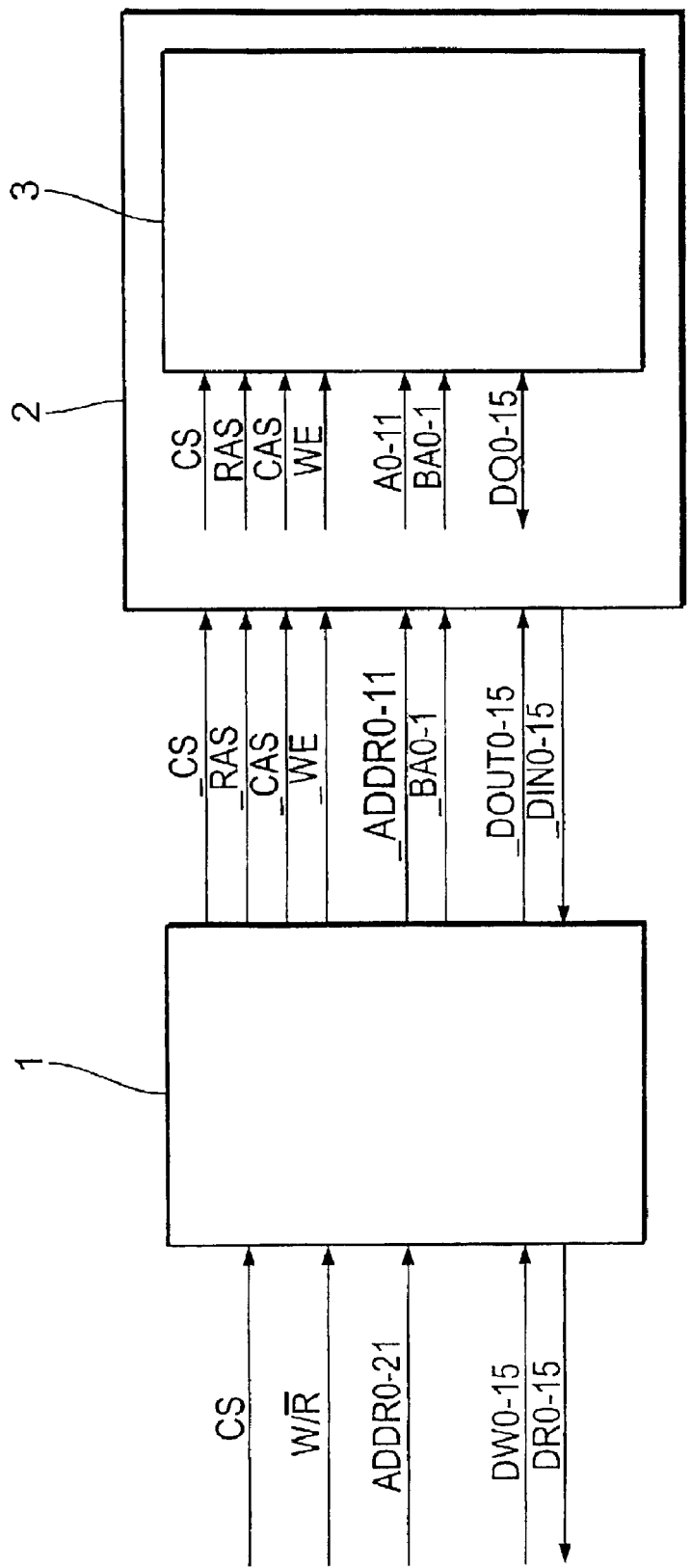
FIG. 1 is a block diagram with a control means for a semiconductor device.

FIG. 1 is a basic block diagram showing triggering of a synchronous dynamic semiconductor memory (SDRAM). In general, a control means 1 is provided, which receives the following signals as input signals: chip select signal CS, write/read select signal W/R, address signal over an address bus ADDR0-21 of (in the present example) 22 bit width. Over a data write bus DW0-15 of (in the present example) 16 bit width, data may be written in, while over a data read bus DR0-15 of (in the present example) 16 bit width, read data may be output.

As output signals, the control means 1 generates the following signals: chip select signal CS, row address strobe signal RAS, column address strobe signal CAS, write signal (write enable) WE, address signal over an address bus ADDR0-11 of (in the present example) 12 bit width and memory bank select signal (bank) BA0-1. Over a data write bus DOUT0-15 of (in the present example) 16 bit width, data to be written may be output, while over a data read bus DIN0-15 of (in the present example) 16 bit width, data may be read in.

The signals output by the control means 1 are fed to a storage unit (shell) 2, which surrounds the actual semiconductor memory device (SDRAM) 3. This substantially reroutes the data write bus DOUT0-15 and the data read bus DIN0-15 to a common data bus DQ0-15. A further test logic may optionally also be incorporated into the storage unit 2.

Figure 2:
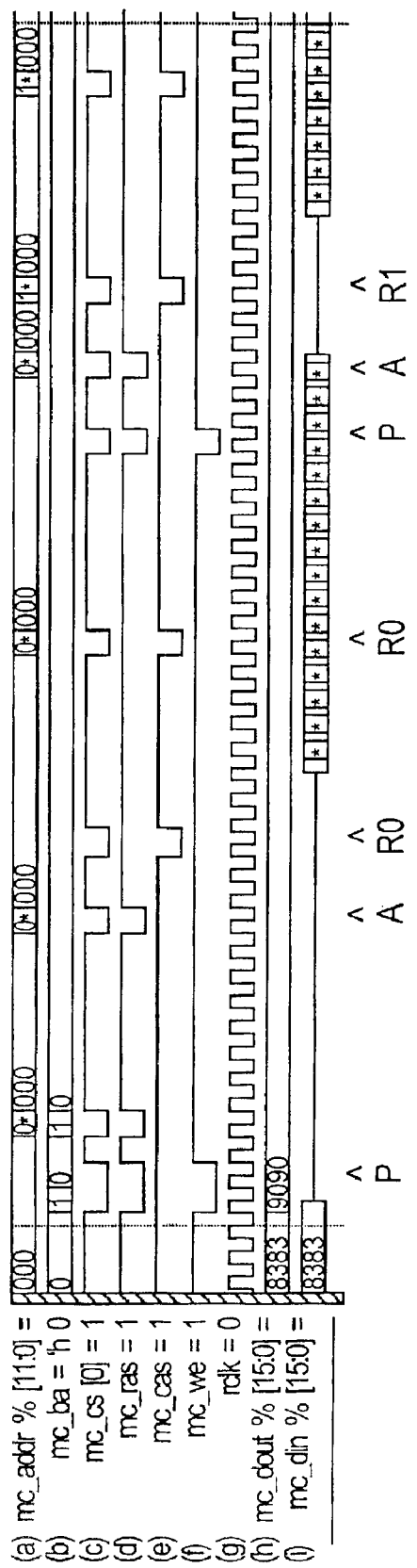
FIG. 2 shows signal profiles for a known random sequential method.

Typical signal profiles for access to a known SDRAM 3 with a known control means are shown in FIG. 2. FIG. 2a shows the address which is in each case to be accessed, wherein "*" functions as a placeholder for non-displayable components of the address. FIG. 2b shows the memory bank select signal BA, wherein 0 or 1 designates the number of the selected memory bank. FIG. 2c shows the chip select signal CS, FIG. 2d shows the row address strobe signal RAS, FIG. 2e shows the column address strobe signal CAS and FIG. 2f shows the write enable signal WE. The signals shown in FIGS. 2c to 2f form the actual command with which access to the memory is prepared and initiated. In what manner these signals have to be switched to perform individual commands is defined in the standard relating to semiconductor memory devices, namely the JEDEC standard, and will not be explained any further here. FIG. 2g shows a clock signal RCLK. FIG. 2h shows the data write bus DOUT, wherein concrete data are illustrated. FIG. 2h shows the data read bus DIN, wherein data are again illustrated.

In the signal profiles, first of all switch-over from write operation to read operation is shown (to the far left in the signal profiles). Two read burst accesses (R0) of the length 8 are then made to the same page (or row) in different columns and, subsequently, a read burst access (R1) is made to a new page (or row). In order to be able to perform the first read burst access R0 to the memory bank 0, the memory bank 0 has firstly to be precharged (precharge, P) and activated (activate, A). The same preparation is necessary before the second read burst access R1 may be made to a new row of the same memory bank.

As is easy to see, several clock cycles pass between the preparation cycles P and A and between the second preparation command A and the actual read access R0 or R1, in which clock cycles the data bus is blocked, which is clear from the several cycles delay at the data bus, however. These delays caused by the preparation cycles result in troublesome time losses in the case of burst accesses, which, according to the invention, may be reduced as much as possible or even prevented.

Figure 3:
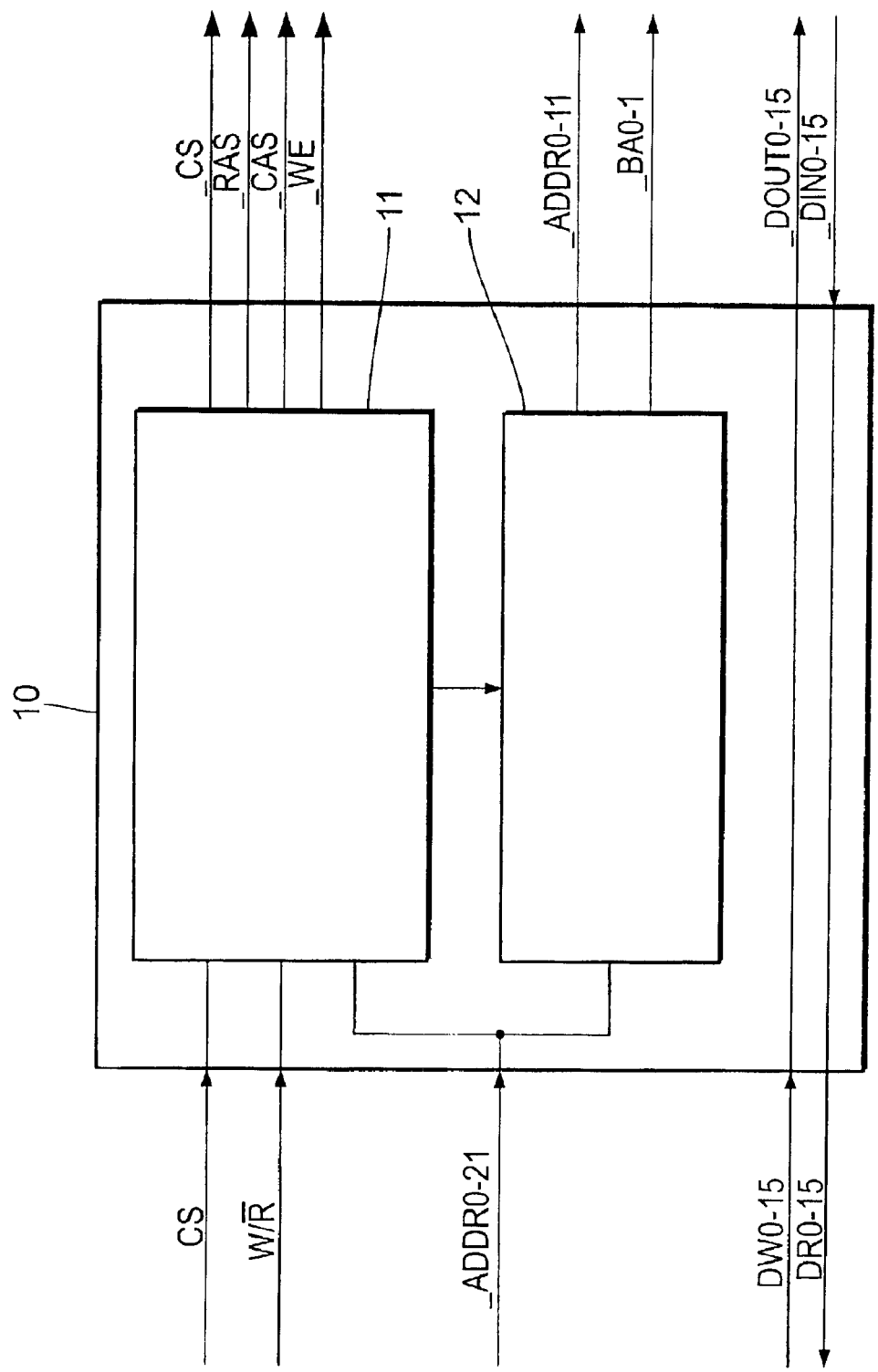
FIG. 3 is a block diagram of a control means according to the invention.

A control means 10 according to the invention is shown in FIG. 3. Input and output signals are identical to the input and output signals of the control means 1 described in FIG. 1, such that compatibility is provided with all synchronous dynamic semiconductor memory devices. The data lines DW0-15 and DR0-15 are "looped through" from the input to the output.

The control and generation of the control signals of the SDRAM and thus the function of subdividing a burst access into at least two partial burst accesses are tasks assumed by a so-called state machine 11 (Finite State Machine). This detects whether a burst access is desired, converts the input signals into corresponding control signals for the SDRAM and optionally forwards the command to an address converter unit 12 to subdivide the burst access into partial burst accesses or to effect conversion of the logical access addresses for the burst access into physical access addresses for the partial burst accesses. The state machine 11 also signals to the address converter unit 12 when which address is to be generated.

The address converter unit 12 converts the logical access addresses incoming over the input address bus ADDR0-21 into physical access addresses and a memory bank signal BA0-1, wherein the physical access addresses are forwarded to the SDRAM over the output address bus ADDR0-11. The conversion according to the invention of the logical access addresses into physical access addresses will now be explained in more detail with reference to FIGS. 4 and 5.

Figure 4:
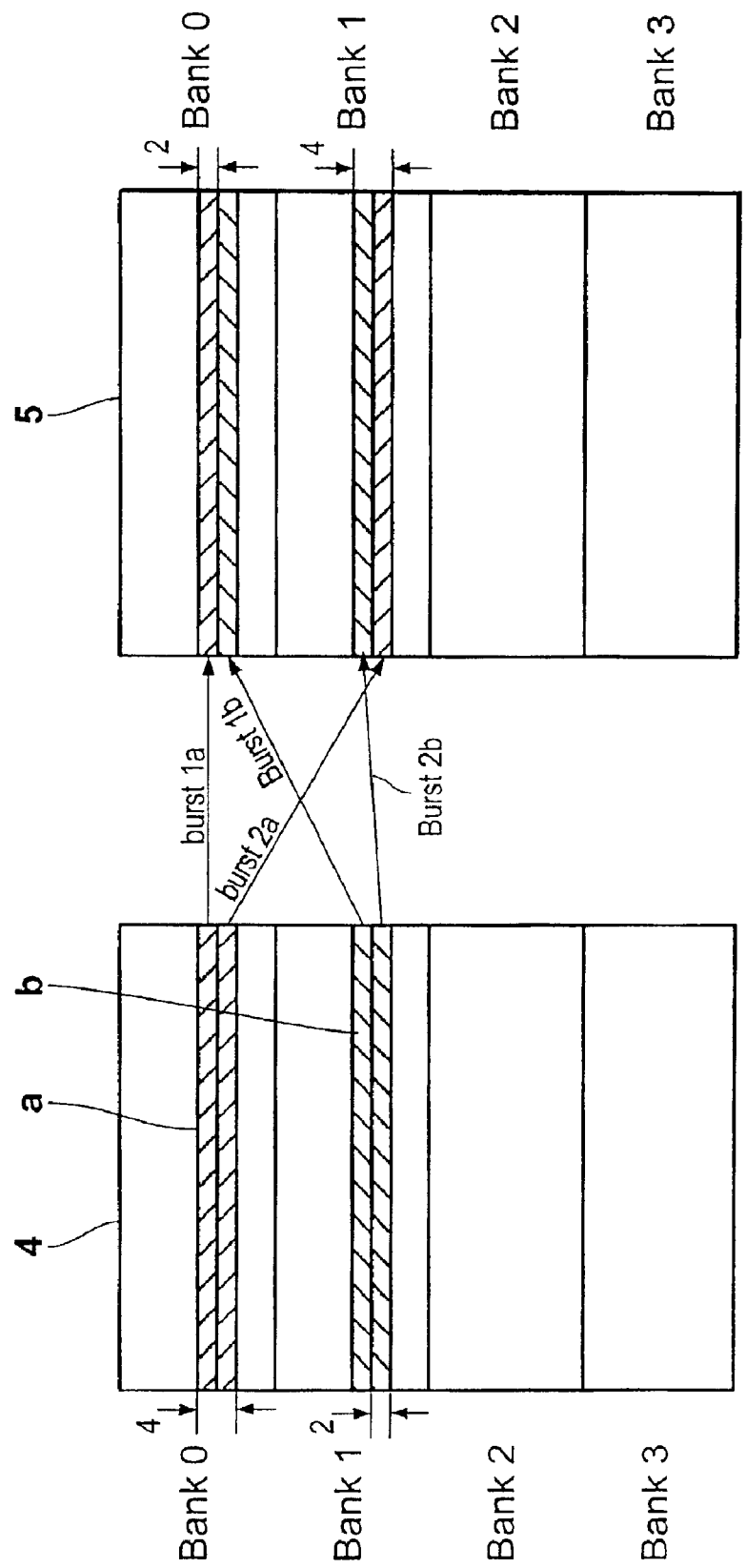
FIG. 4 is a diagram explaining the cross-addressing according to the invention.

FIG. 4 shows a first option for address conversion according to the invention, namely "cross-addressing". A logical address space 4, which is also designated as original or virtual address space, is shown therein with in this case four memory banks (bank 0 to bank 3). This logical address space 4 is addressed by logical access addresses, which are fed to the memory means 10, if access is to be made for example in the context of a burst access to a memory area of the SDRAM.

FIG. 4 additionally shows a physical address space 5, which is also designated real address space. This physical address space also comprises four memory banks (bank 0 to bank 3), which does not necessarily have to be the case, however. Individual memory cells of the SDRAM are addressed explicitly in this physical address space 5 by physical access addresses. Conversion of the logical access addresses of the logical address space 4 into physical access addresses of the physical address space 5 is effected according to the invention by the address converter unit 12.

In the example shown in FIG. 4, two burst accesses a and b each of the length four take place in succession. According to the invention, the first burst access a, which addresses a logical address area of the memory bank 0 of the logical address space 4, is initially split into two partial burst accesses 1a and 2a each of the length two. The first partial burst access 1a addresses a first memory area of the first memory bank 0, while the second partial burst access 2*a* addresses a second memory area of the second memory bank 1. To perform the burst access a, the partial burst accesses 1*a* and 2*a* are thus performed consecutively, i.e. the address areas of the memory bank 0 and the memory bank 1 of the physical memory are accessed in succession. The advantage is that the second partial burst access 2*a* may be being prepared during execution of the first partial burst access 1*a*, since access is made in this case to a different memory bank. A waiting time due to preparation cycles is thus dispensed with.

If a second burst access b is then to be made to the logical address area corresponding to access 1, but in the memory bank 1 of the logical address space 4, this burst access b is in turn split into two partial burst accesses 1*b* and 2*b*. Address conversion is performed in that the first partial burst access 1*b* accesses a second memory area of the memory bank 0 of the physical address space 5, while the second partial burst access 2*b* addresses a memory area of the memory bank 1 of the physical address space 5. Addressing is preferably performed in such a way that the data of the partial burst accesses 1*a* and 1*b* or 2*a* and 2*b* respectively in each case adjoin one another, such that in both memory banks 0 and 1 of the physical address space 5 the same memory areas are written to or read from, once the two burst accesses a and b have been executed.

In general terms, the address conversion according to the invention of a logical access address A of a memory bank X takes place, in the case of a burst access of the length N, in such a way that a first partial burst access of the length N/2 to a first physical access address B of a first memory bank Y and a second partial burst access of the length N/2 to a second physical access address C of a second memory bank Y+X takes place, wherein Z is a whole number not equal to 0, preferably +1 if Y is an even whole number or −1 if Y is an odd whole number. The first memory bank Y of the physical addressing preferably corresponds to the memory bank X of the logical addressing; the first physical access address B of the physical addressing preferably corresponds to the logical access address A of the logical addressing and the second physical access address C preferably corresponds to the logical access address A+N/2.

Figure 5:
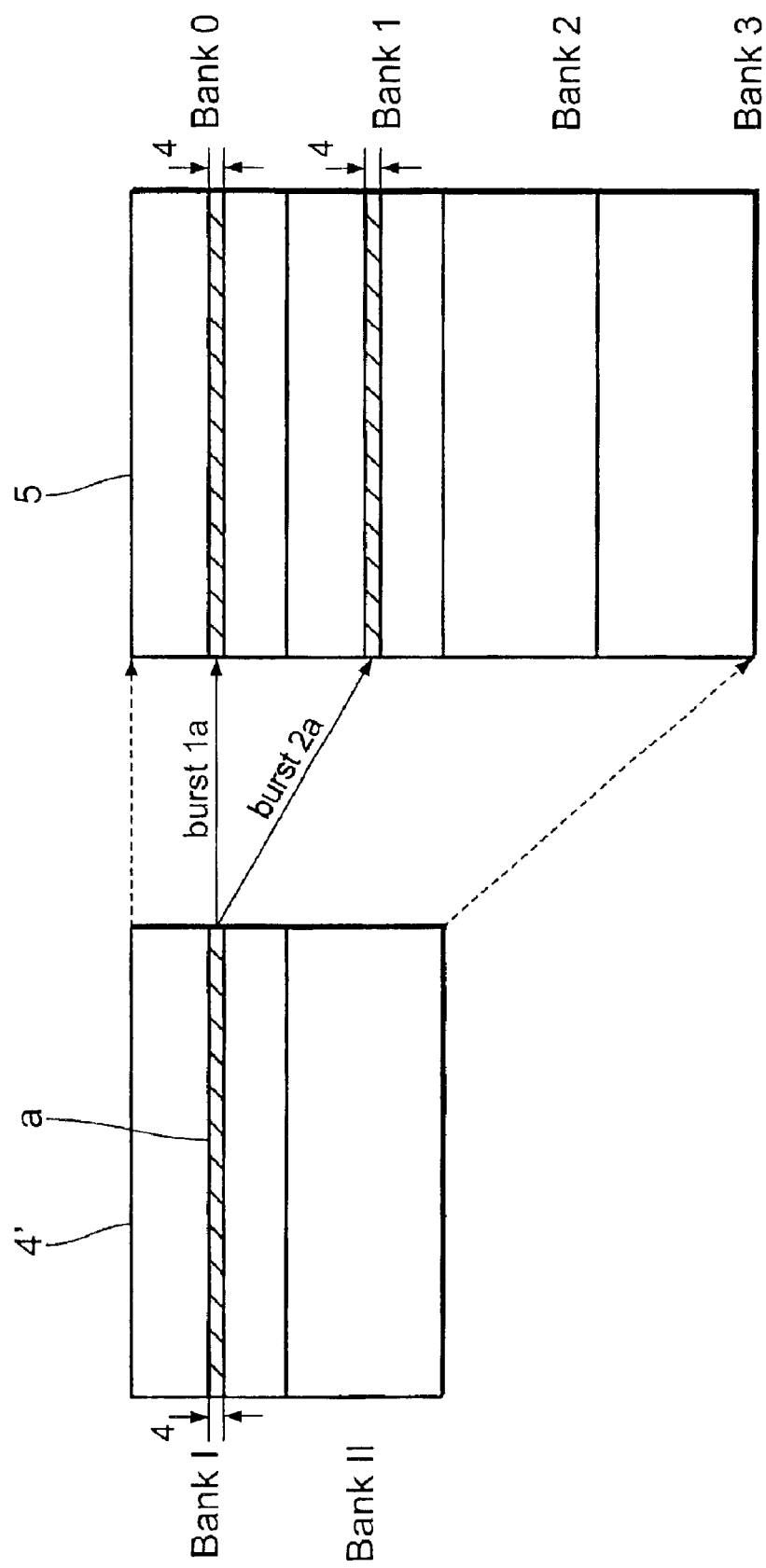
FIG. 5 is a diagram explaining address space compression according to the invention.

FIG. 5 shows a second option according to the invention for converting logical access addresses into physical access addresses. This Figure again shows a logical address space 4' and a physical address space 5, wherein the logical address space 4' is however compressed relative to the physical address space 5 as well as relative to the logical address space 4 illustrated in FIG. 4, in the example by the factor 2. Thus, N memory banks of the physical address space become N/2 memory banks in the logical address space 4' or A physical access addresses become A/2 logical access addresses in the event of a reduction of the address space by the factor 2. This corresponds to the omission of one bit during addressing in the logical address space 4' relative to addressing in the physical address space 5.

A burst access a, in which a logical access address A of a memory bank I is addressed in the logical address space 4', is split in this development of the method according to the invention into two (or more) partial burst accesses 1*a* and 2*a*, which each address a different memory bank, but preferably the identical physical access address of the physical address space 5. In general, a physical access address B of a first memory bank Y is thus addressed with the partial burst access 1*a* and a second physical access address B of a second memory bank Y+Z with the second partial burst access 2*a*, wherein Z is a whole number not equal to 0 and wherein preferably A=B. The partial burst accesses 1*a* and 2*a* are in turn executed consecutively, wherein during execution of the first partial burst access 1*a*, the second partial burst access 2*a* is prepared, in order to avoid unnecessary waiting times for preparation commands.

Figure 6:
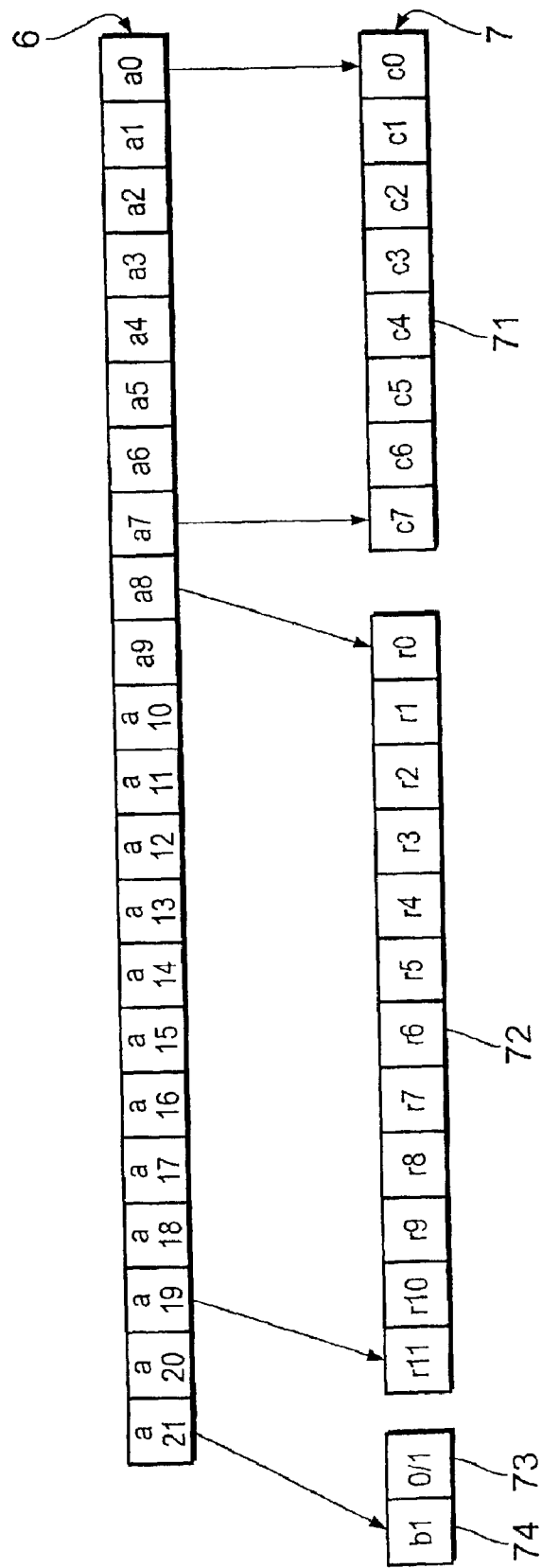
FIG. 6 shows the address allocation of logical and physical address space.

The conversion according to the invention of the logical access addresses into physical access addresses is performed in the method described in FIG. 5 by adding one bit; in other words, the logical access addresses arise from the physical access addresses by omission of one bit, in particular of the memory bank bit identifying the memory banks in the physical address space 5. This is shown in FIG. 6. A logical access address 6, consisting of 22 address bits a0–a21, is shown therein which is fed over the address bus to the control means in the event of a burst access. Therebelow is shown the physical address 7 generated in the control means according to the invention, in particular the address conversion unit, which address 7 consists of a plurality of components 71 to 74.

According to the invention, the lowest eight bits a0 to a7 of the logical access address 6 are mapped to the column address 71 with the column address bits c0 to c7, and the next 12 bits a8 to a18 of the logical access address are re-routed to the row address 72 with the row address bits r0 to r11. The top two address bits a20 and a21 correspond to the memory bank bits 73, 74 of the SDRAM, wherein the top address bit a21 is mapped to the top bank bit 74 (b1) while the lower address bit a20 is masked out. According to the invention, the memory bank bit 73 is generated or added only in the address converter device, i.e. it is toggled by setting to 0 for the first partial burst access and to 1 for the second partial burst access. Effectively, therefore, only 21 and not 22 address bits are available in the logical address space, which corresponds to the above-described compression by the factor 2.

Figure 7:
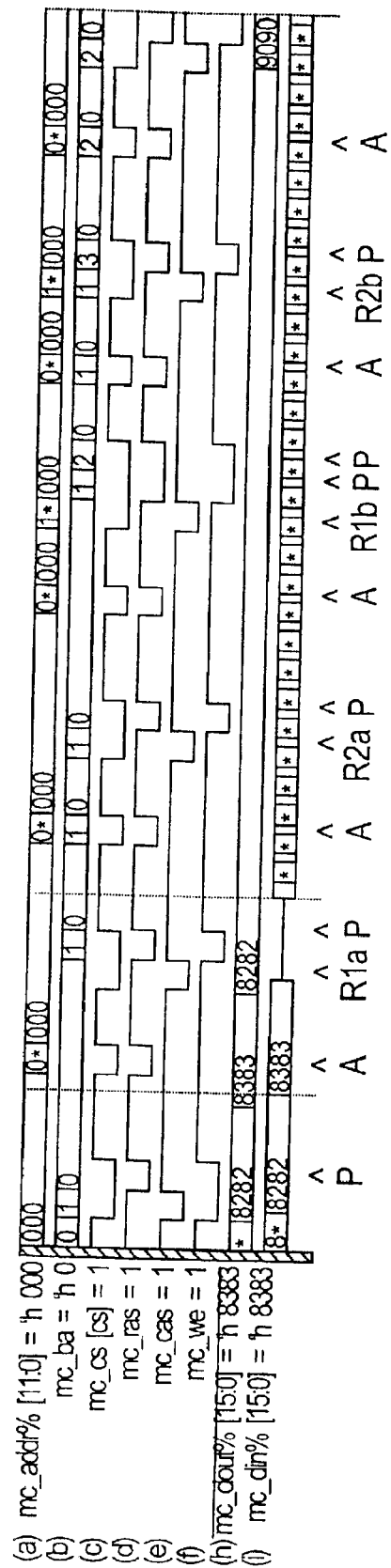
FIG. 7 shows signal profiles for the method according to the invention.

Signal profiles relating to a control means according to the invention are shown in FIG. 7 for the address compression described in FIGS. 5 and 6. Four read accesses R1*a*, R2*a*, R1*b*, R2*b* are shown therein, wherein read accesses R1*a* and R1*b* access the memory bank 0 (see memory bank signal in FIG. 7*b*) and read accesses R2*a* and R2*b* access the memory bank 1. As may be seen, first of all the memory bank 0 is prepared by precharge P and activate A, before the first read access R1*a* to the memory bank 0 takes place. However, it is not then necessary, as in the case of the signal profile in FIG. 2, to wait to prepare the memory bank 1 until the first read access R1*a* has been fully executed, but rather the memory bank 1 is prepared immediately the read command R1*a* by precharge P and activate A, which memory bank 1 is then accessed immediately by the second read access R2A, as soon as the first read access R*a* is completed. The memory bank is then immediately re-prepared and the third read access R1*b* to the memory bank 0 takes place as soon as the second read access R2*a* is completed. The memory bank 1 is then prepared again, before the fourth read access R2*b* thereto takes place.

At the same time, the first preparation steps of the preparation operations for access to the memory banks 2 and 3 are also shown, which may take place at the same time as preparation of or at the same time as read accesses to the memory banks 0 and 1. Delays due to preparation cycles are thus dispensed with completely, depending on the corresponding SDRAM type and the time delays associated therewith.

The invention is not restricted to the examples described. In principle, any burst access may also be split into more than two partial burst accesses and the different physical access addresses of the different memory banks in the physical address space do not necessarily have to adjoin one another. In principle, the partial burst accesses may also exhibit different lengths; however implementation is simpler if the partial burst accesses are of the same length. The invention is also not limited to particular types of SDRAM, but rather may be applied to any SDRAMs with at least 2 memory banks, since, as shown in FIG. 3, no changes to existing control means are made with regard to the in- and output signals of the control means. The essential elements of the control means for carrying out the method according to the invention could also be incorporated into the storage unit (2 in FIG. 1) surrounding the SDRAM (3 in FIG. 1).

What is claimed is:

1. A control means (10) for controlling burst accesses to a synchronous dynamic semiconductor memory device (3) comprising at least two memory banks, having an address converter unit (12) for converting a logical access address into physical access addresses by splitting the burst access into at least two partial burst accesses, wherein a first physical access address addresses a first memory area of a first memory bank for a first partial burst access and wherein a second physical access address addresses a second memory area of a second memory bank for a second partial burst access, and the first partial burst access and second partial burst access are performed consecutively wherein a second partial burst access is prepared during a first partial burst access.

2. A control means as claimed in claim 1, characterized in that the control means (10) is so designed that column addresses of the first and second physical access addresses adjoin one another.

3. A control means as claimed in claim 1, characterized in that the control means (10) is so designed that, during a partial burst access to the memory area of a first memory bank addressed by the first physical access address, another partial burst access to a memory area of another memory bank addressed by a further physical access address is prepared.

4. A control means as claimed in claim 1, characterized in that the address converter unit (12) is so designed that a burst access of the length N to a logical access address A of a memory bank X is subdivided into a first partial burst access of the length N/2 to a first physical access address B, preferably the access address A, of a first memory bank Y, preferably to memory bank X, and a second partial burst access of the length N/2 to a second physical access address C, preferably the access address A+N/2 of a second memory bank Y+Z, preferably the memory bank X+Z, wherein Z is a whole number not equal to zero, preferably +1 if Y is an even whole number or −1 if Y is an odd whole number.

5. A control means as claimed in claim 1, characterized in that the address converter unit (12) is so designed that a burst access of the length N to a logical access address A of a memory bank X is subdivided into a first partial burst access of the length N/2 to a first physical access address B of a first memory bank Y and a second partial burst access of the length N/2 to a second physical access address B of a second memory bank Y+Z, wherein Z is a whole number not equal to zero and wherein A is preferably equal to B.

6. A control means as claimed in claim 5, characterized in that the address converter limit (12) is designed for conversion of the logical access addresses into physical access addresses by the addition of at least one bit for determining the memory bank.

7. A method of controlling burst accesses to a synchronous dynamic semiconductor memory device (3) comprising at least two memory banks, wherein a logical access address is converted into physical access addresses by splitting the burst access into at least two partial burst accesses, wherein a first physical access address addresses a first memory area of a first memory bank for a first partial burst access and wherein a second physical access address addresses a second memory area of a second memory bank for a second partial burst access, and the first partial burst access and second partial burst access are performed consecutively wherein a second partial burst access is prepared during a first partial burst access.

8. A video memory arrangement with a control means as claimed in claim 1, wherein the semiconductor memory device (3) is provided for storing video data.

* * * * *